United States Patent
Sharma et al.

(10) Patent No.: US 11,488,904 B2
(45) Date of Patent: Nov. 1, 2022

(54) SYSTEM AND METHOD FOR REDUCING MUTUAL COUPLING FOR NOISE REDUCTION IN SEMICONDUCTOR DEVICE PACKAGING

(71) Applicant: NXP B.V., Eindhoven (NL)

(72) Inventors: Ajay Kumar Sharma, Delhi (IN);
Rishi Bhooshan, Uttar Pradesh (IN);
Sumit Varshney, Greater Noida (IN);
Frank Martin Paglia, Georgetown, TX (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/178,157

(22) Filed: Feb. 17, 2021

(65) Prior Publication Data

US 2022/0208672 A1 Jun. 30, 2022

(30) Foreign Application Priority Data

Dec. 30, 2020 (IN) .............................. 202021057068

(51) Int. Cl.
*H01L 23/522* (2006.01)
*H01L 23/552* (2006.01)
*H01L 21/50* (2006.01)
*H01L 23/64* (2006.01)

(52) U.S. Cl.
CPC .......... *H01L 23/5225* (2013.01); *H01L 21/50* (2013.01); *H01L 23/552* (2013.01); *H01L 23/642* (2013.01); *H01L 23/645* (2013.01)

(58) Field of Classification Search
CPC ............................ H01L 23/5225; H01L 21/50
USPC ................................................ 257/659, 695
See application file for complete search history.

(56) References Cited

U.S. PATENT DOCUMENTS

| 8,575,742 B1 * | 11/2013 | Kim .................. H01L 23/49541 257/730 |
| 9,147,656 B1 | 9/2015 | Varshney et al. |
| 9,337,140 B1 | 5/2016 | Kumar et al. |

* cited by examiner

*Primary Examiner* — Quoc D Hoang

(57) ABSTRACT

A mechanism is provided to reduce noise effects on signals traversing bond wires of a SOC by forming a bond wire ring structure that decreases mutual inductance and capacitive coupling. Bond wires form the ring structure in a daisy chain connecting isolated ground leads at a semiconductor device package surrounding the semiconductor device. This structure reduces out-of-plane electromagnetic field interference generated by signals in lead wires, as well as mutual capacitance and mutual inductance.

20 Claims, 7 Drawing Sheets

SYSTEM AND METHOD FOR REDUCING MUTUAL COUPLING FOR NOISE REDUCTION IN SEMICONDUCTOR DEVICE PACKAGING

BACKGROUND

Field

This disclosure relates generally to semiconductor devices, and more specifically, to reducing mutual coupling in order to reduce cross-talk noise between leads of a semiconductor device package.

Related Art

Advances in semiconductor technologies have led to shrinking dimensions within integrated circuits and, particularly, decreasing pitch for contact leads on a silicon die and semiconductor device packages. The increasing frequency of use of digital and mixed-analog systems on a chip (SOC) results in a corresponding increase in electromagnetic radiation. The SOCs affect nearby devices or are adversely impacted by other devices in the vicinity.

High speed communication applications further exacerbate issues associated with electrically-coupling semiconductor devices. In high-speed applications, electric field generated noise can easily transfer from one lead extending from a semiconductor device die in a semiconductor device package to a neighboring lead. For example, signal bond wires extending from device signal leads to contact pads on the SOC die are susceptible to noise coupling, both as sources and recipients.

It is therefore desirable to implement a shield that can reduce the noise effects on the signals traversing the bond wires of the SOC.

BRIEF DESCRIPTION OF THE DRAWINGS

Embodiments of the present invention may be better understood by referencing the accompanying drawings.

The use of the same reference symbols in different drawings indicates identical items unless otherwise noted. The figures are not necessarily drawn to scale.

DETAILED DESCRIPTION

Embodiments of the present invention reduce noise effects on signals traversing bond wires of a SOC by forming a bond wire ring structure that decreases mutual inductance and capacitive coupling. Bond wires form the ring structure in a daisy chain connecting isolated ground leads at a semiconductor device package surrounding the semiconductor device. This structure reduces out-of-plane electromagnetic field interference generated by signals in lead wires, as well as mutual capacitance and mutual inductance.

Figure 1A:
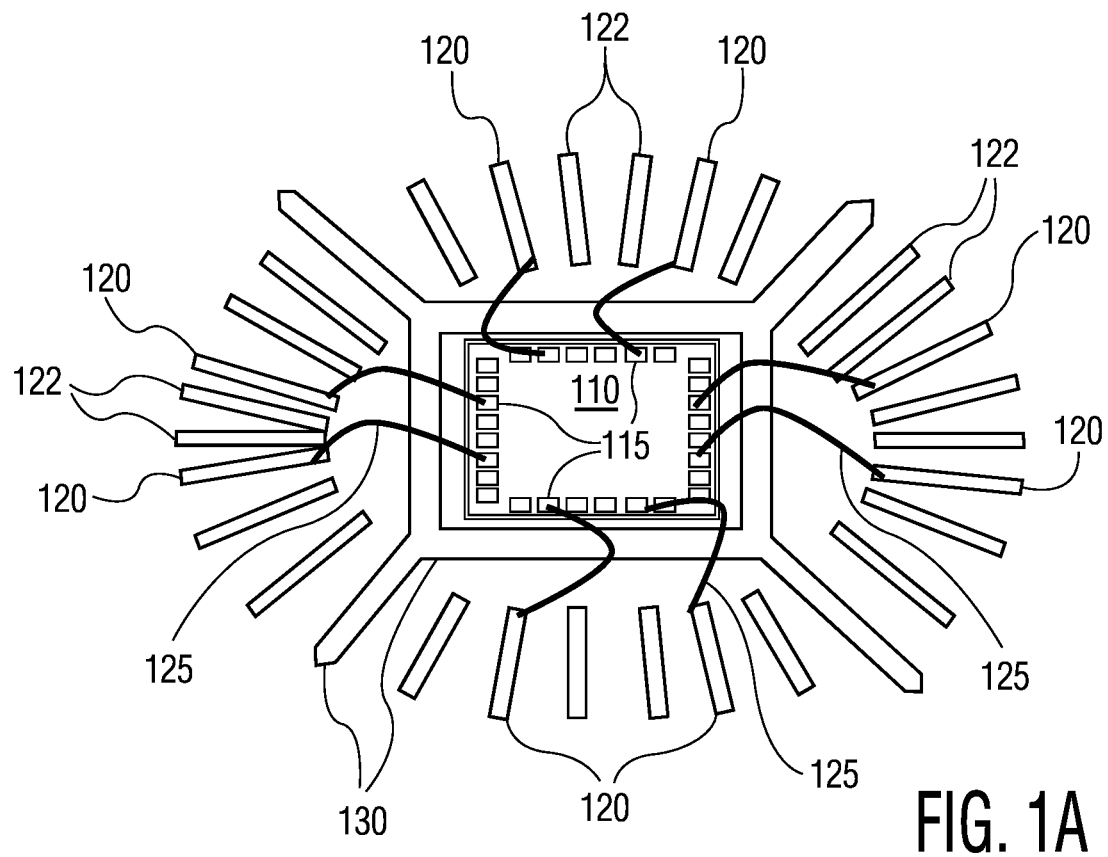
FIG. 1A is a simplified block diagram illustrating an example of a semiconductor device package incorporating a semiconductor device die surrounded by semiconductor device package leads.

FIG. 1A is a simplified block diagram illustrating an example of a semiconductor device package incorporating a semiconductor device die 110 surrounded by semiconductor device package leads 120 and 122. Semiconductor device die 110 is typically in the form of an integrated circuit (IC) or the like. Semiconductor device die 110 can be made from any semiconductor material or combinations of materials, such as gallium arsenide, silicon germanium, silicon-on-insulator (SOI), silicon, monocrystalline silicon, the like, and combinations of the above. In addition, semiconductor device die 110 can implement various types of circuits, such as a processor, a controller, or the like, and in many embodiments implements a system-on-a-chip (SOC). Semiconductor device die 110 is mounted on a lead frame, or ground flag, 130, which can provide structural support for electrical connections for the semiconductor device die.

Semiconductor device die 110 includes a plurality of contact pads, which in turn, includes several ground, or Vss, pads 115. The semiconductor device package includes a plurality of package leads 120 and 122 around the perimeter of the semiconductor device to which semiconductor device die 110 is electrically connected (e.g., by a bond wire) via the contact pads. Each of the package leads is preferably made from a conductive material, such as copper, aluminum, or the like. The plurality of package leads can also be coded, alloyed, or pre-plated with a metal layer or layers such as silver, gold, nickel, palladium, tin, or the like.

The number and shapes of the package leads can be varied as necessary depending on the end-use configurations and other such factors. As illustrated in FIG. 1, the package leads surround a periphery of semiconductor device die 110 in a rectangular shape, although other configurations can be used, depending on size requirements, the shape of the semiconductor device die, and other factors. As will be understood by those of skill in the art, the package leads can be part of ground flag 130.

A plurality of bond wires 125 are used to electrically couple ground pads 115 to corresponding ground package leads 120. Bond wires 125 are attached using a conventional wire bonding process. Bond wires 125 are preferably in a form of gold or copper wires, although other materials can be used. While not illustrated as such, signal package leads 122 can also be electrically coupled to additional contact pads on semiconductor device die 110, thereby providing a mechanism for electrical signals to pass to and from the IC on semiconductor device die 110.

As illustrated, ground package leads 120 are provided adjacent to a pair of signal package leads 122. Through such placement, the ground package leads provide some electrical isolation for the neighboring signal leads, thereby reducing electromagnetic interference between the signal leads. But due to electromagnetic fields being generated in three dimensions around a signal lead, there still can be some electromagnetic interference and coupling between signal leads due to electromagnetic interactions out of the plane formed by the semiconductor device package leads. Embodiments of the present invention are configured to reduce these out of plane interactions.

Figure 1B:
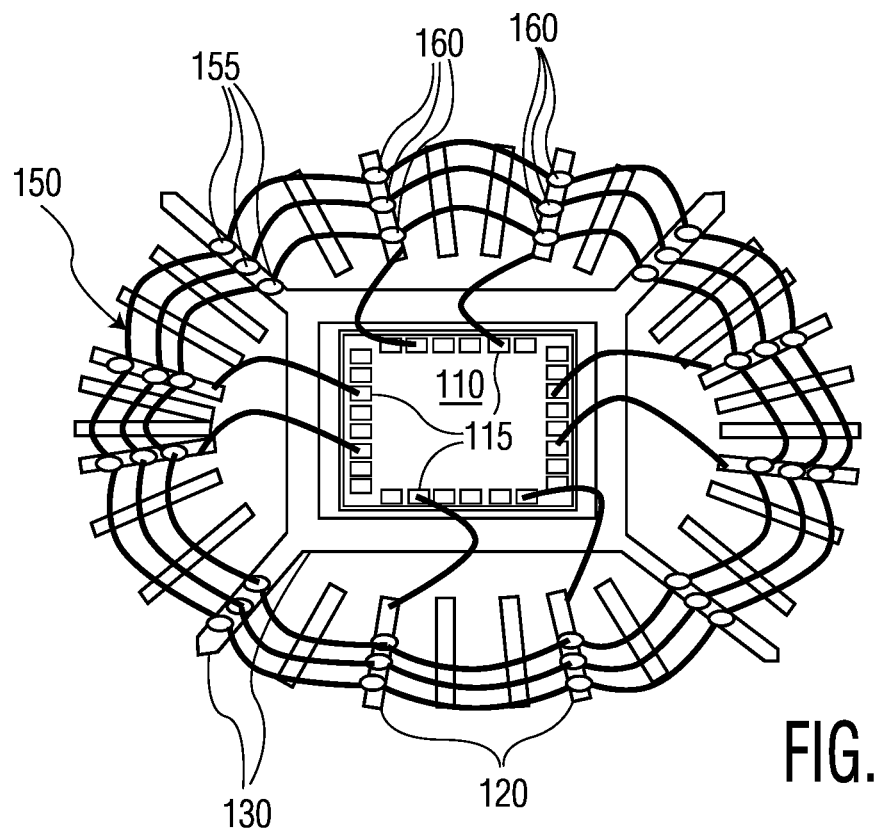
FIG. 1B is a simplified block diagram illustrating the semiconductor device package of FIG. 1A incorporating an example embodiment of the present invention.

FIG. 1B is a simplified block diagram illustrating the semiconductor device package of FIG. 1A incorporating an example embodiment of the present invention. As illustrated, a set of bond wires 150 are daisy chained to couple each ground lead 120 both to one another and to ground flag 130. Bond wires 150 connect landing points 155 on ground flag 130 to corresponding landing points 160 on ground package leads 120. As with bond wires 125, bond wires 150 can be attached using a conventional wire bonding process. One or more daisy chains of bond wires 150 can be formed encircling semiconductor device die 110. The set of bond wire daisy chains form a bond wire ring structure that acts as a ground shield in the semiconductor device package lead region of the semiconductor device package. This ground shield reduces the out-of-plane electromagnetic interference between the signal package leads that can generate mutual inductance and mutual capacitance, as will be discussed in greater detail below.

Figure 2A:
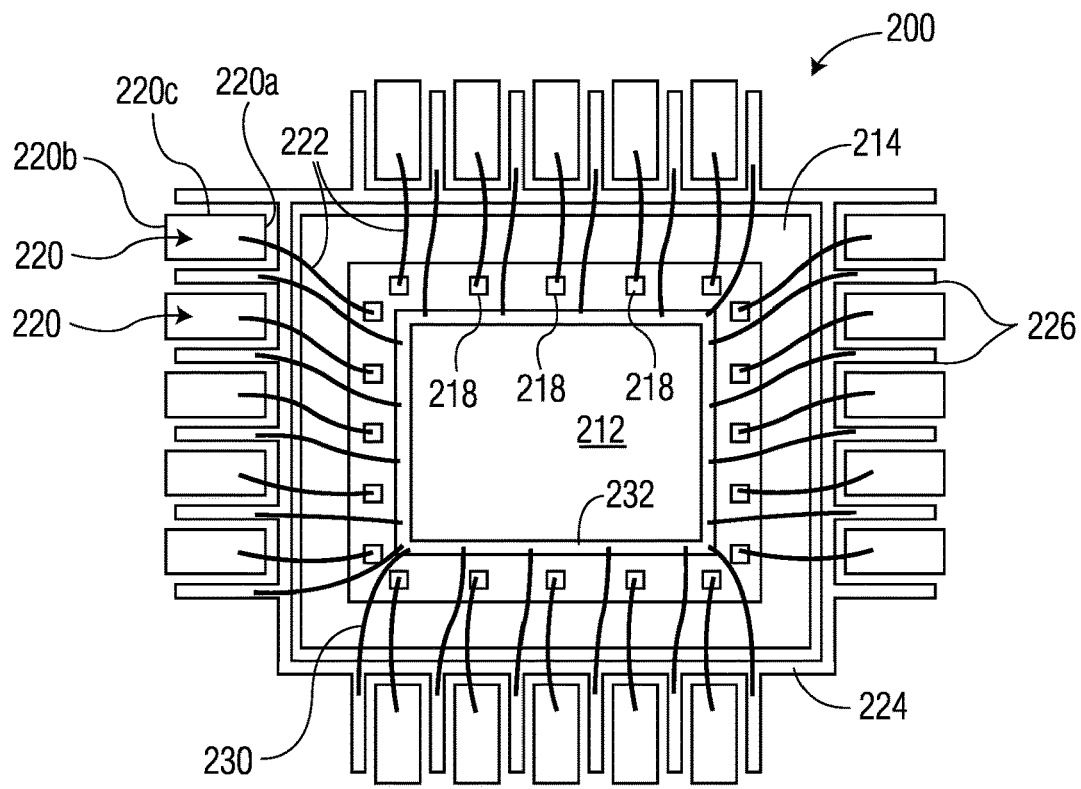
FIG. 2A is a simplified block diagram illustrating an example semiconductor device package layout used to reduce electromagnetic interference between signal pads in the prior art.

FIG. 2A is a simplified block diagram illustrating an example semiconductor device package layout used to reduce electromagnetic interference between signal pads in the prior art. The semiconductor device 200 includes a semiconductor die 212 that is typically in the form of an integrated circuit (IC) or the like. The semiconductor die 212 is mounted on a die flag 214, which may provide structural support or electrical connections for the semiconductor die 212.

Semiconductor die 212 includes a plurality of contact pads 218 on main surface 212. The contact pads 118 receive input/output signals, power signals, or the like. Semiconductor device 200 further includes a plurality of signal leads 220 to which semiconductor die 212 is electrically connected via contact pads 218.

Each signal lead 220 has a first end 220a located proximate to semiconductor die 212, a second end 220b located remotely from semiconductor die 112, and a body 120c extending between the first and second ends 120a and 120b. Signal leads 220 preferably surround a periphery of the semiconductor die 212 in a rectangular shape, although other configurations may be used as well, depending on size requirements. As will be understood by those of skill in the art, flag 214 and leads 220 may be parts of a conventional lead frame.

A plurality of signal bond wires 222 is used to electrically couple the signal leads 220 to respective contact pads 218 of semiconductor die 212. Signal bond wires 222 can be attached using a conventional wire bonding process.

One or more dummy lead frames 224 are disposed between first ends 220a of signal leads 220 and the semiconductor die 212. While a single dummy lead frame 224 is shown as having branches that extend along all four sides of semiconductor die 212, portions of the dummy lead frame may be separated into multiple, discrete parts corresponding to different sides of the semiconductor die, individual or sets of signal leads 220, or the like.

Dummy lead frame 224 is also connected to a fixed potential for the purpose of providing shielding of the signal leads 220. The fixed potential can be ground, although other potentials can be used as well, depending on the application and the voltages applied to signal leads 220 and semiconductor die 212. Dummy lead frame 224 is further illustrated as having portions 226 that extend between signal leads 220. Portions 226 provide electromagnetic shielding in the plane of signal leads 220.

Semiconductor device 200 further includes a plurality of shield bond wires 230 that couple dummy lead frame 224 to semiconductor die 212, thereby providing shielding for signal bond wires 222. Specifically, semiconductor die 212 includes a metal ring 232 to which the shield bond wires 230 are connected.

Shield bond wires are adjacent to and extend substantially parallel with respective signal bond wires. Thus, each signal bond wire 222 has a shield bond wire 230 on at least one side that extends substantially parallel to the signal bond wire 222. While this provides side-to-side shielding between the signal bond wires, while the portions 226 provide side-to-side shielding between signal leads 220, there is no electromagnetic shielding around the top of the leads or semiconductor device die.

Figure 2B:
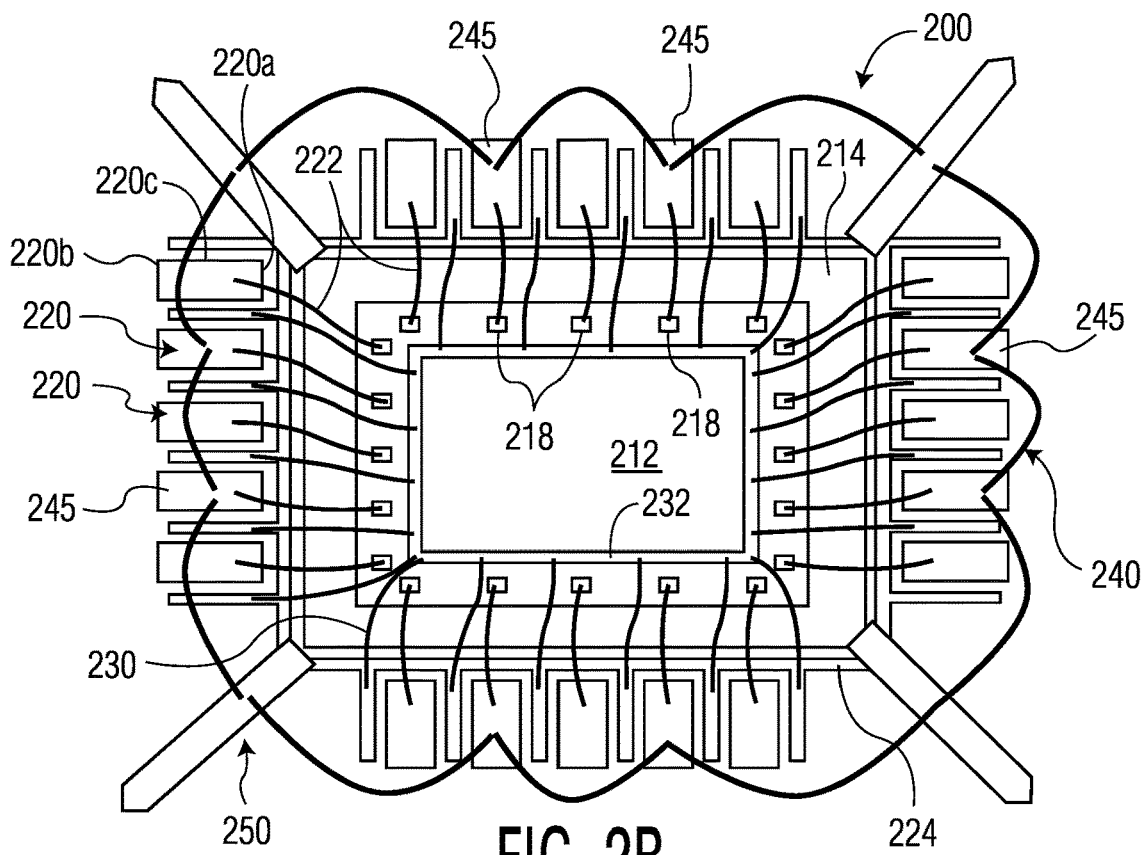
FIG. 2B is a simplified block diagram illustrating an improvement to the example semiconductor device package layout of FIG. 2A, in accordance with embodiments of the present invention.

FIG. 2B is a simplified block diagram illustrating an improvement to the example semiconductor device package layout of FIG. 2A, in accordance with embodiments of the present invention. A daisy chain of bond wires forming a bond wire ring structure 240 connects isolated ground leads (e.g. leads 245) to one another and to ground flag 250. The bond wire ring structure provides shielding to all signal leads at a package level that reduces mutual coupling and forms a ground shield in a region out of the plane of the signal leads. As with the example illustrated in FIG. 1B, the bond wire daisy chain can be formed using conventional bond wire techniques to connect the landing points on ground leads 245 and ground flag 250.

Figure 3:
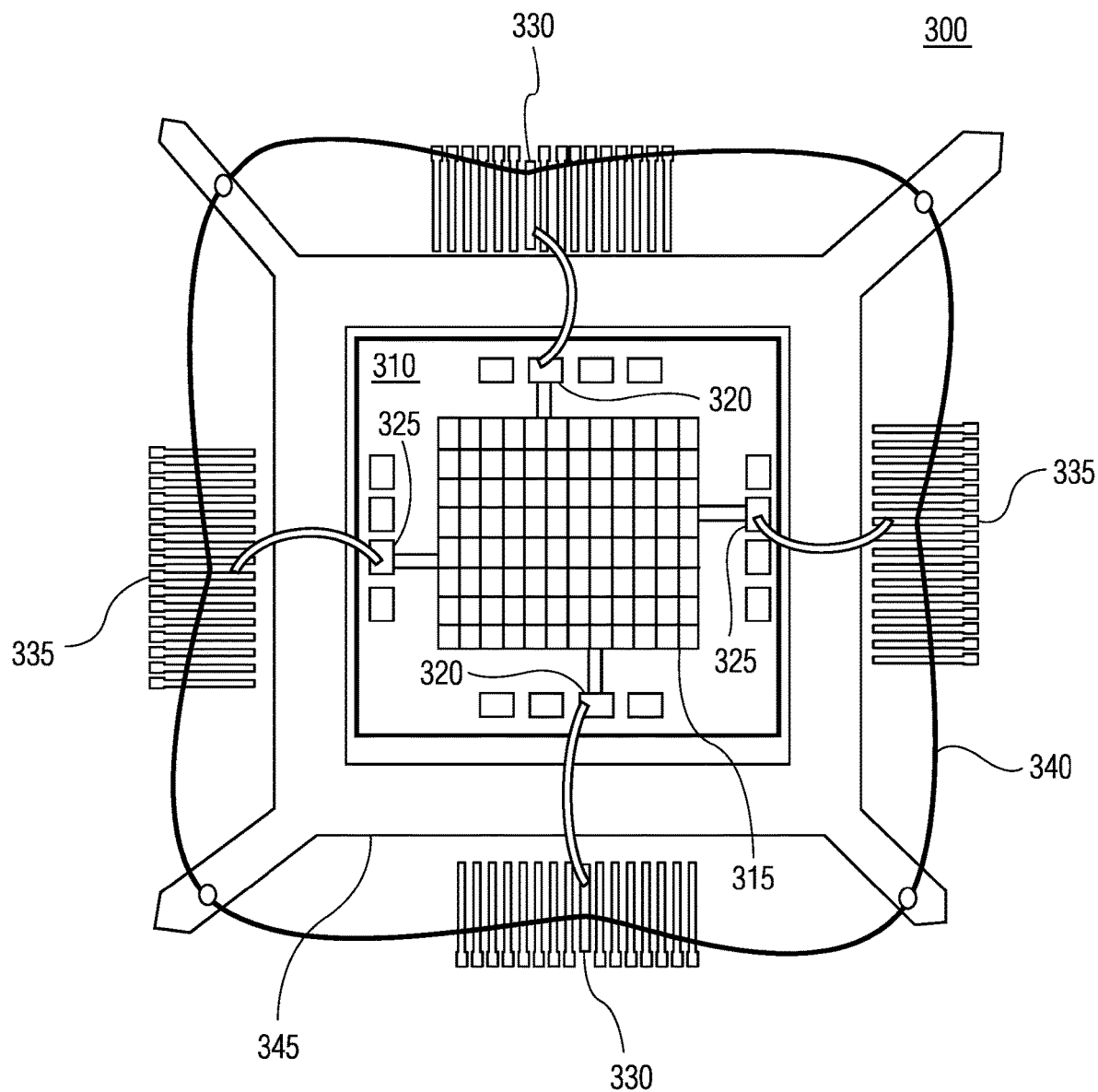
FIG. 3 is a simplified block diagram illustrating an alternative example embodiment of a semiconductor device package.

FIG. 3 is a simplified block diagram illustrating an alternative example embodiment of a semiconductor device package 300. A semiconductor device die 310 incorporates a Vss (ground) grid 315 in a core region of an IC formed on the semiconductor device die. Semiconductor device die 310 further incorporates a set of signal pads that include Vss pads 320 and 325, which are coupled to the Vss grid.

In certain low power semiconductor package designs, ground pins are not provided on all sides of the package due to required GPIO functionality. In a region external to and in proximity to a perimeter of semiconductor device die 310, are located a set of signal leads including dummy leads 330 and ground leads 335. Dummy leads 330 are coupled to Vss pads 320, while ground leads 335 are coupled to Vss pads 325. Such coupling can be provided by, for example, wire bonds such as those described with regard to FIGS. 1B and 2B.

Embodiments of the present architecture couple the dummy leads formed around the periphery at the package level using bond wires (e.g., bond wires 340) to ground leads 335 and ground flag 345, which surrounds the semiconductor device die perimeter. As with the example embodiments illustrated in FIGS. 1B and 2B, bond wires 340 form a bond wire ring structure that provides shielding in the perimeter region of the second conductor device package.

In addition to providing electromagnetic shielding, the proposed bond wire ring structure creates a new parallel path for current and thereby decreases equivalent resistance of the ground. The bond wires between each package lead provides a resistive element between each package lead. Embodiments have been shown to provide an equivalent resistance drop of about 28%.

Figure 4:
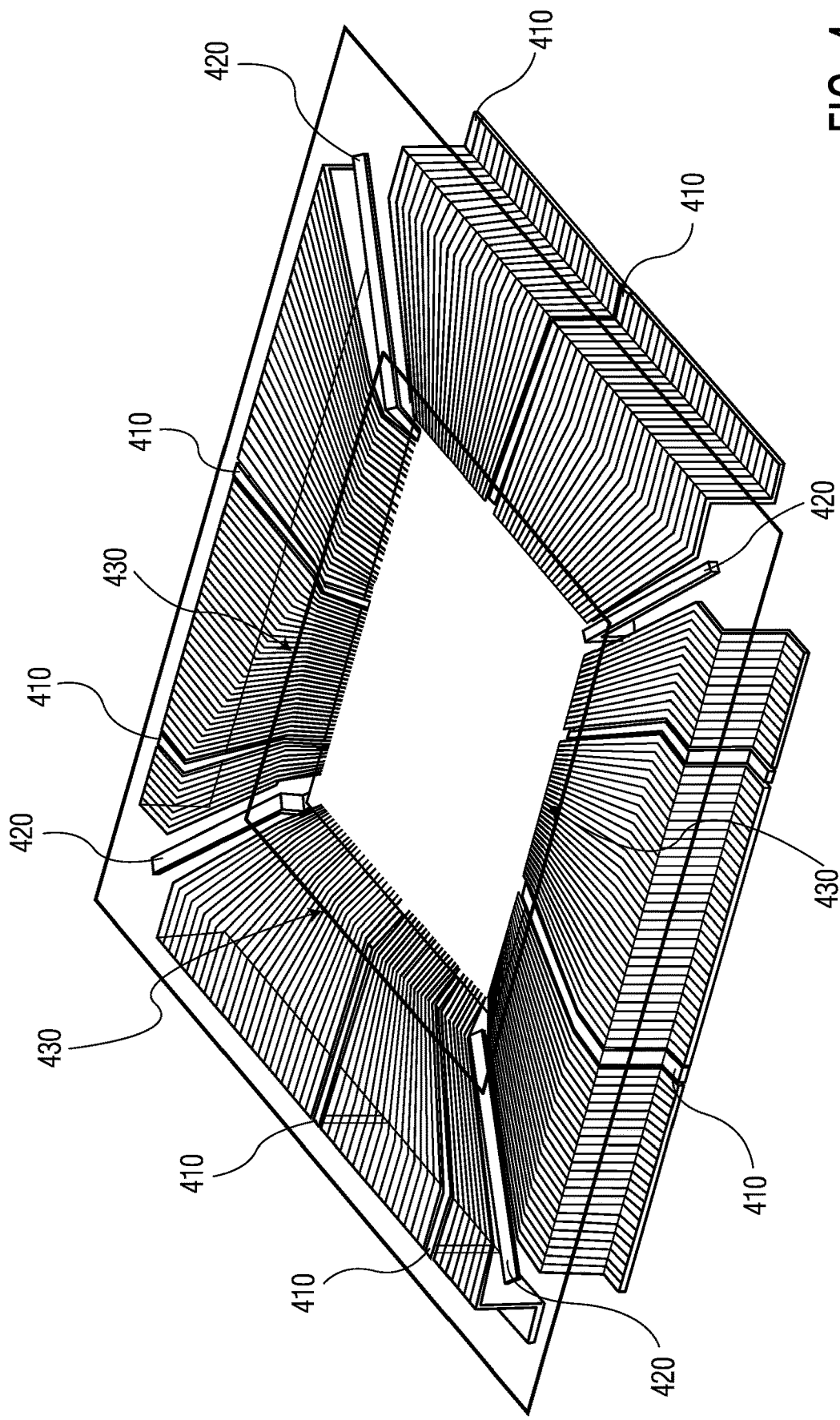
FIG. 4 is a simplified perspective diagram illustrating an example of a daisy chain bond wire configuration, in accordance with embodiments of the present invention.

FIG. 4 is a simplified perspective diagram illustrating an example of a bond wire ring structure configuration, in accordance with embodiments of the present invention. Ground leads 410 are found in several locations around the periphery of the semiconductor device package. In addition, ground flag 420 extends away from the center die area of the package in the corner regions of the periphery of the semiconductor device package. A bond wire daisy chain 430 is formed that couples each of the ground leads and the ground flag. As can be seen in this perspective illustration, the bond wires ring structure extends above the leads around the central package die region, forming a ground shield in this region and around the entire periphery of the die region.

Figure 5:
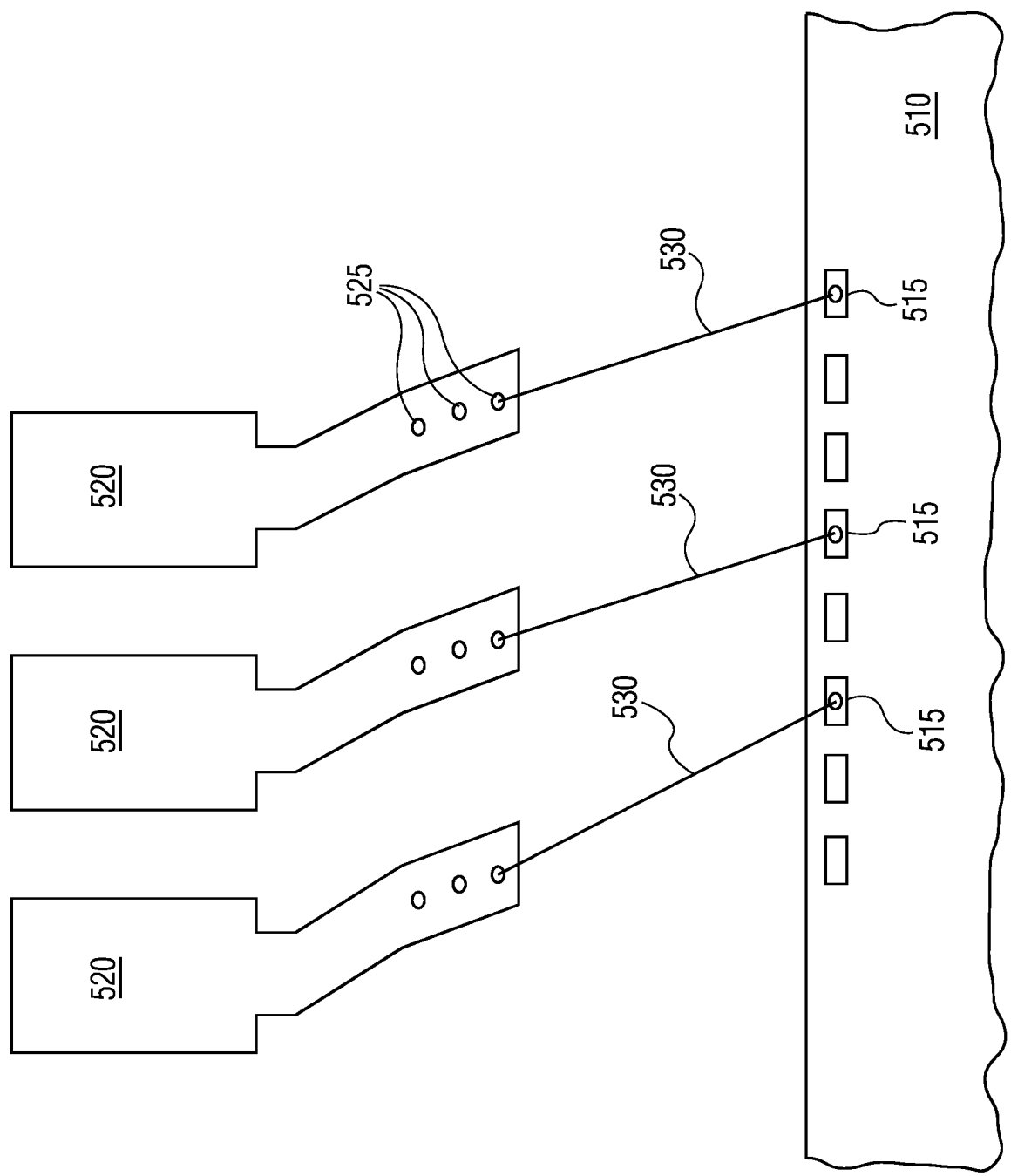
FIG. 5 is a simplified block diagram illustrating an example of locations in which the bond wire daisy chain can be coupled, in accordance with embodiments of the present invention.

FIG. 5 is a simplified block diagram illustrating an example of locations in which the bond wire daisy chain can be coupled, in accordance with embodiments of the present invention. As illustrated, a semiconductor device die 510 incorporates a set of pads that include ground pads 515. In a region around the periphery of semiconductor device die 510 are a set of leads 520. Ground pads 515 are coupled to corresponding leads 520 by wire bonds 530. Wire bond 530 are bonded from a ground pad to a landing point 525 on the corresponding lead 520. Each of leads 520 has multiple landing points 525. Landing points that are not used to couple the lead to a corresponding pad can be used to form a bond wire that is part of a daisy chain from ground lead to ground lead or ground lead to ground flag.

Figure 6:
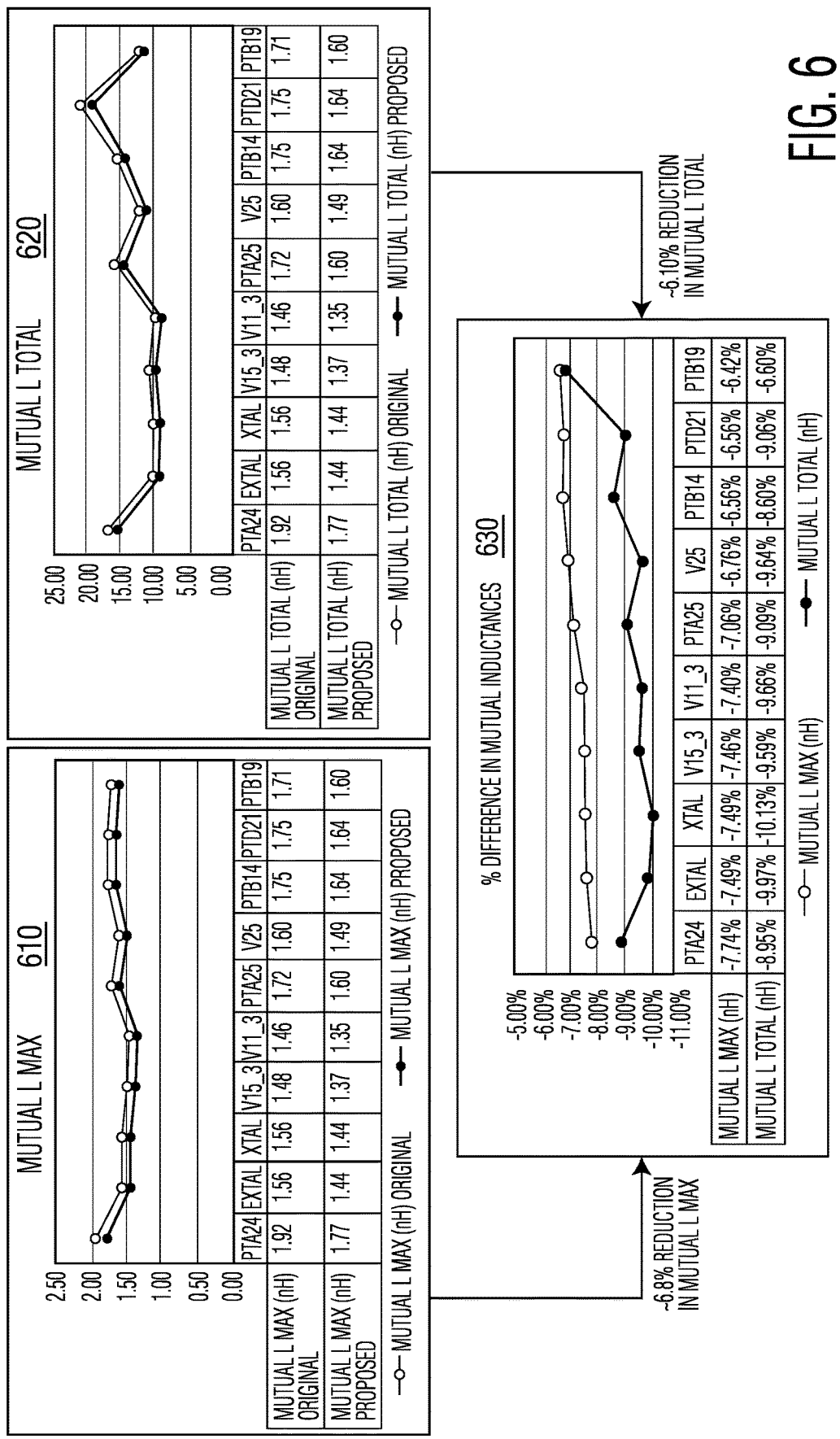
FIG. 6 provides values for maximum mutual inductance and total mutual inductance for devices that do not incorporate embodiments of the present invention and devices that do incorporate embodiments.
Figure 7:
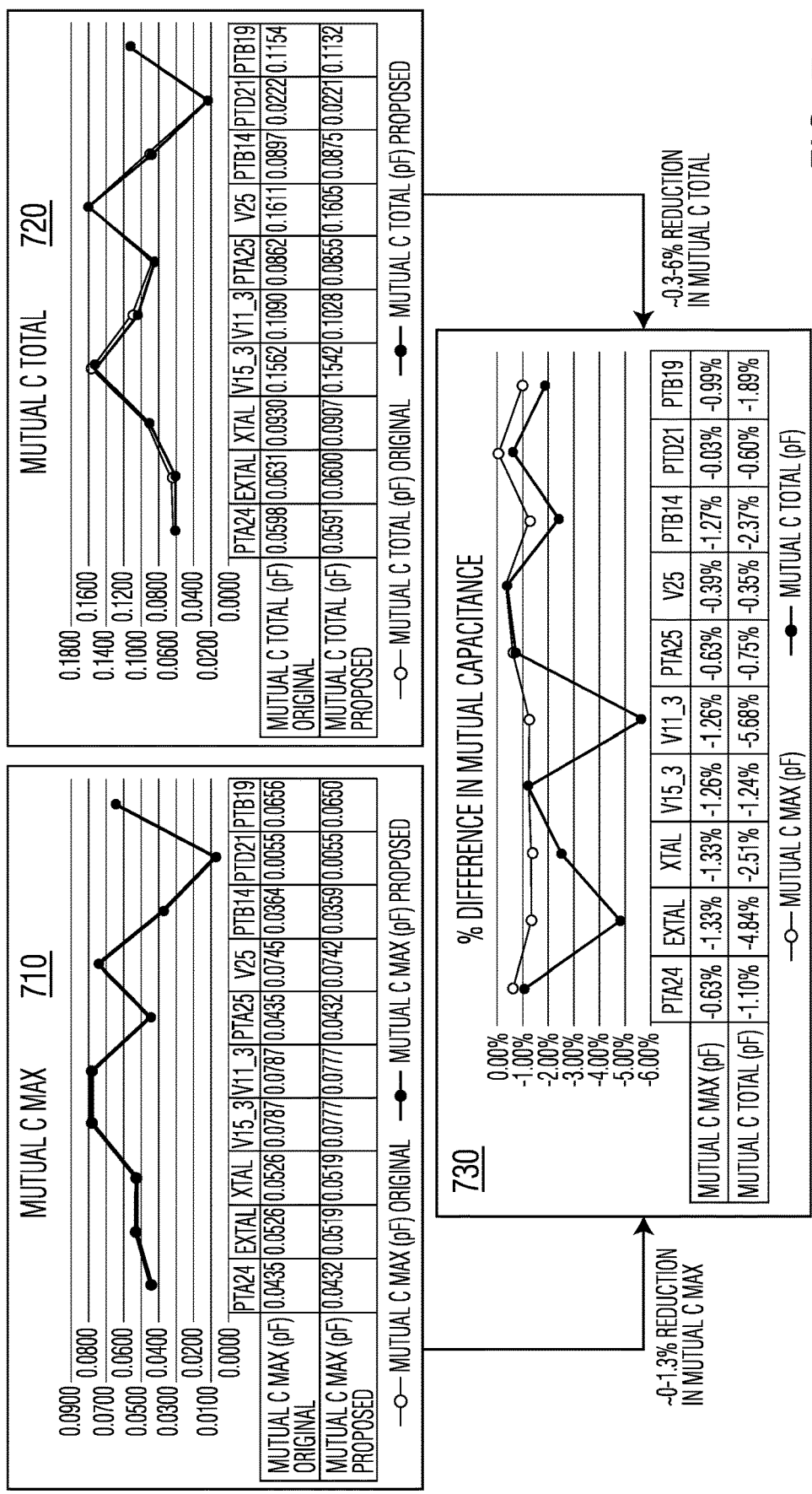
FIG. 7 provides values for maximum mutual capacitance and total mutual capacitance for devices that do not incorporate embodiments of the present invention (upper line) and devices that do incorporate embodiments (lower line).

FIGS. 6 and 7 provide example data associated with reduction in mutual inductance and mutual capacitance provided by embodiments of the present invention. For each of FIGS. 6 and 7, the graphs illustrate measured values at pins around a semiconductor device package.

FIG. 6 provides values for maximum mutual inductance in graph 610 and total mutual inductance in graph 620 for devices that do not incorporate embodiments of the present invention (upper line) and devices that do incorporate embodiments (lower line). The percentage difference in mutual inductances is illustrated in graph 630, where it is established that embodiments provide a 6-8% reduction in maximum mutual inductance and a 6-10% reduction in total mutual inductance.

FIG. 7 provides values for maximum mutual capacitance in graph 710 and total mutual capacitance in graph 724 for devices that do not incorporate embodiments of the present invention (upper line) and devices that do incorporate embodiments (lower line). The percentage difference in mutual capacitance is illustrated in graph 730, where it is established that embodiments provide a 0-1.3% reduction in maximum mutual capacitance and a 0.3-6% reduction in total mutual capacitance.

Embodiments of the bond wire ring structure around a semiconductor device die in a semiconductor device package lead to a decrease in mutual inductive and capacitive coupling, thereby reducing noise in signal lines. In addition, embodiments of the bond wire ring structure provide a parallel ground current path that aids in reducing the IR drop at the semiconductor device package level. The daisy chain a bond wires that connects isolated ground leads forming the ground shield thereby helps to avoid interference between signal lines.

In the embodiments shown herein, some (up to and including all) of the plurality of die pads are connected to a signal line of active circuitry that may carry either a radio frequency (RF) signal or may carry a non-RF signal (e.g., a power supply signal like Vss or Vdd).

Semiconductor device die 110 may be singulated from a semiconductor wafer, which can be any semiconductor material or combinations of materials, such as gallium arsenide, silicon germanium, silicon-on-insulator (SOI), silicon, monocrystalline silicon, the like, and combinations of the above. Such a semiconductor die includes active circuitry, which may include integrated circuit components that are active when the die is powered. The active circuitry is formed on the semiconductor wafer using a sequence of numerous process steps applied to semiconductor wafer, including but not limited to depositing semiconductor materials including dielectric materials and metals, such as growing, oxidizing, sputtering, and conformal depositing, etching semiconductor materials, such as using a wet etchant or a dry etchant, planarizing semiconductor materials, such as performing chemical mechanical polishing or planarization, performing photolithography for patterning, including depositing and removing photolithography masks or other photoresist materials, ion implantation, annealing, and the like. In some embodiments, the active circuitry may be a combination of integrated circuit components or may be another type of microelectronic device. Examples of integrated circuit components include but are not limited to a processor, memory, logic, oscillator, analog circuitry, sensor, MEMS (microelectromechanical systems) device, a standalone discrete device such as a resistor, inductor, capacitor, diode, power transistor, and the like.

It is noted that in some embodiments, the active circuitry of semiconductor device die 110 may include a radio frequency (RF) block that implements an RF transmitter, an RF receiver, or both. The RF block may implement front end components of the RF transmitter, RF receiver, or both, where the front-end components may include but are not limited to a transmitter power amplifier, a receiver low noise amplifier, one or more baluns, one or more filters, a circulator or other coupling device to the antenna, impedance matching elements, an oscillator, a phase locked loop, and other appropriate front end elements. The front-end components of the RF block may have configurable settings to adjust the transmit signal or receive signal. In some embodiments, the RF block may have an operating frequency that falls within a frequency band of 300 to 500 MHz, although other operating frequencies that fall within other radio frequencies may be implemented in other embodiments.

By now it should be appreciated that there has been provided a semiconductor device that includes a semiconductor device die, a ground flag where the semiconductor device die is mounted on a major surface of the ground flag and one or more portions of the ground flag extend beyond an area contacting the semiconductor device die, and a plurality of signal leads located around a perimeter of the ground flag and semiconductor device die. The semiconductor device die includes a plurality of ground signal pins and a plurality of signal pins formed on a top major surface of the semiconductor device die. Each of the plurality of ground signal pins is electrically coupled to a corresponding ground signal lead of the plurality of signal leads. Each of the plurality of signal pins is electrically coupled to a corresponding signal lead of the plurality of signal leads. The semiconductor device further includes a bond wire ring structure formed by a daisy chain of bond wires coupling each ground signal lead to a nearest proximity other ground signal lead or a nearest proximity portion of the ground flag extending beyond the area contacting the semiconductor device die. The bond wire ring structure forms a closed loop around the semiconductor device die.

In one aspect of the above embodiment, the semiconductor device further includes a second bond wire ring structure formed by a second daisy chain of bond wires coupling each ground signal lead to the nearest proximity other ground signal lead or a nearest proximity portion of the ground flag extending beyond the area contacting the semiconductor device die. The second bond wire ring structure forms a second closed-loop around the semiconductor device die. The second bond wire ring structure is located in a region where the bond wire ring structure is located between the semiconductor device die and the second bond wire ring structure.

In another aspect of the above embodiment, the bond wires forming the bond wire ring structure formed in a region near the plurality of signal leads that provides a ground shield between pairs of signal leads. In another aspect, one or more of the ground signal leads includes a dummy lead that is not connected to a lead external to the semiconductor device package. In still another aspect of the above embodiment, each of the plurality of ground signal leads includes a plurality of bond wire landing points. In yet another aspect of the above embodiment, the bond wire ring structure is configured to reduce mutual inductance between pairs of signal leads. In still another aspect of the above embodiment, the bond wire ring structure is configured to reduce mutual capacitance between pairs of signal leads.

Another embodiment provides a method for reducing mutual coupling in a semiconductor device package. The method includes providing a ground flag, affixing a semiconductor device die to a major surface of the ground flag where one or more portions of the ground flag extend beyond an area contacting the semiconductor device die, providing a plurality of signal leads around a perimeter of the ground flag and the semiconductor device die, coupling each of a plurality of ground signal pins formed on a top major surface of the semiconductor device die to a corresponding ground signal lead of the plurality of signal leads, coupling each of a plurality of signal pins formed on the top major surface of the semiconductor device die to a corresponding signal lead of the plurality of signal leads, and forming a bond wire ring structure using a daisy chain of bond wires. The daisy chain of bond wires couples each ground signal lead to a nearest proximity other ground signal lead or a nearest proximity portion of the ground flag extending beyond the area contacting the semiconductor device die. The bond wire ring structure forms a closed-loop around the semiconductor device die.

In one aspect of the above embodiment, the method further includes forming a second bond wire ring structure using a second daisy chain a bond wires. The second daisy chain a bond wires couples each ground signal lead to the nearest proximity other ground signal lead or the nearest proximity portion of the ground flag extending beyond the area contacting the semiconductor device die. The second bond wire ring structure forms a second closed-loop around the semiconductor device die. The second bond wire ring structure is formed in a region where the bond wire ring structure is located between the semiconductor device die and the second bond wire ring structure.

In another aspect of the above embodiment, the method further includes forming the bond wire ring structure in a region near the plurality of signal leads such that the bond wire ring structure provides a ground shield between pairs of signal leads. In still another aspect, one or more of the ground signal leads includes a dummy lead that is not connected to a lead external to the semiconductor device package. In yet another aspect, each of the plurality of ground signal leads includes a plurality of bond wire landing points. In another aspect, the method further includes forming the bond wire ring structure in a region to reduce mutual induction between pairs of signal leads. In still another aspect, the method further includes forming the bond wire ring structure in a region to reduce mutual capacitance between pairs of signal leads.

Another embodiment of the present invention provides a semiconductor device package that includes a plurality of signal leads located in a perimeter region around a semiconductor device die region, a plurality of ground signal leads where the plurality of ground signal leads are a subset of the plurality of signal leads, one or more dummy leads where the one or more dummy leads are a second subset of the plurality of signal leads and the dummy leads are not configured to carry a supplied signal, and a bond wire ring structure formed by a daisy chain of bond wires coupling each ground signal lead or dummy lead to a nearest proximity other ground signal lead or other dummy lead where the bond wire ring structure forms a closed-loop around the semiconductor device die region.

In one aspect of the above embodiment, the semiconductor device package further includes a ground flag placed in the semiconductor device die region. The ground flag includes one or more portions that extend into the perimeter region. The bond wire ring structure further couples a ground signal lead to a nearest proximity portion of the ground flag that extends into the perimeter region. In a further aspect, the semiconductor device package further includes a semiconductor device die affixed to the ground flag. The semiconductor device die includes a plurality of ground signal pins formed on an exposed major surface of the semiconductor device die. Each of the plurality ground signal pins is electrically coupled to a corresponding ground signal lead of the plurality ground signal leads or a dummy lead of the one or more dummy leads.

In a further aspect, the semiconductor device die further includes a plurality of signal pins formed on the exposed major surface of semiconductor device die, each of the plurality of signal pins is electrically coupled to a corresponding signal lead of the plurality of signal leads, and the bond wires forming the bond wire ring structure formed in a region near the plurality of signal leads that provides a ground shield between pairs of signal leads. In still a further aspect, the bond wire ring structure is configured to reduce mutual inductance between pairs of signal leads. In another further aspect, the bond wire ring structure is configured to reduce mutual capacitance between pairs of signal leads.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, embodiments are not limited to a number of pads coupled via the daisy chain bond wires described. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor device comprising:
    a semiconductor device die, wherein the semiconductor device die comprises a plurality of ground signal pins and a plurality of signal pins formed on a top major surface of the semiconductor device die;
    a ground flag, wherein the semiconductor device die is mounted on a major surface of the ground flag and one or more portions of the ground flag extend beyond an area contacting the semiconductor device die;
    a plurality of signal leads located around a perimeter of the ground flag and semiconductor device die, wherein
        each of the plurality of ground signal pins is electrically coupled to a corresponding ground signal lead of the plurality of signal leads, and
        each of the plurality of signal pins is electrically coupled to a corresponding signal lead of the plurality of signal leads; and
    a bond wire ring structure formed by a daisy chain of bond wires coupling each ground signal lead to a nearest proximity other ground signal lead or a nearest proximity portion of the ground flag extending beyond the area contacting the semiconductor device die, wherein the bond wire ring structure forms a closed loop around the semiconductor device die.

2. The semiconductor device of claim 1 further comprising:
    a second bond wire ring structure formed by a second daisy chain of bond wires coupling each ground signal lead to the nearest proximity other ground signal lead or a nearest proximity portion of the ground flag extending beyond the area contacting the semiconductor device die, wherein
        the second bond wire ring structure forms a second closed loop around the semiconductor device die, and
        the second bond wire ring structure is located in a region where the bond wire ring structure is located between the semiconductor device die and the second bond wire ring structure.

3. The semiconductor device of claim 1, wherein the bond wires forming the bond wire ring structure are formed in a region near the plurality of signal leads that provides a ground shield between pairs of signal leads.

4. The semiconductor device of claim 1, wherein one or more of the ground signal leads comprises a dummy lead that is not connected to a lead external to the semiconductor device package.

5. The semiconductor device of claim 1, wherein each of the plurality of ground signal leads comprises a plurality of bond wire landing points.

6. The semiconductor device of claim 1, wherein the bond wire ring structure is configured to reduce mutual inductance between pairs of signal leads.

7. The semiconductor device of claim 1, wherein the bond wire ring structure is configured to reduce mutual capacitance between pairs of signal leads.

8. A method for reducing mutual coupling in a semiconductor device package, the method comprising:
    providing a ground flag;
    affixing a semiconductor device die to a major surface of the ground flag, wherein
        one or more portions of the ground flag extend beyond an area contacting the semiconductor device die;
    providing a plurality of signal leads around a perimeter of the ground flag and the semiconductor device die;
    coupling each of a plurality of ground signal pins formed on a top major surface of the semiconductor device die to a corresponding ground signal lead of the plurality of signal leads;
    coupling each of a plurality of signal pins formed on the top major surface of the semiconductor device die to a corresponding signal lead of the plurality of signal leads; and
    forming a bond wire ring structure using a daisy chain of bond wires, wherein
        the daisy chain of bond wires couples each ground signal lead to a nearest proximity other ground signal lead or a nearest proximity portion of the ground flag extending beyond the area contacting the semiconductor device die, and
        the bond wire ring structure forms a closed loop around the semiconductor device die.

9. The method of claim 8 further comprising:
    forming a second bond wire ring structure using a second daisy chain of bond wires, wherein
        the second daisy chain of bond wires couples each ground signal lead to the nearest proximity other ground signal lead or the nearest proximity portion of the ground flag extending beyond the area contacting the semiconductor device die,
        the second bond wire ring structure forms a second closed loop around the semiconductor device die, and
        the second bond wire ring structure is formed in a region where the bond wire ring structure is located between the semiconductor device die and the second bond wire ring structure.

10. The method of claim 8 further comprising:

forming the bond wire ring structure in a region near the plurality of signal leads such that the bond wire ring structure provides a ground shield between pairs of signal leads.

11. The method of claim 8, wherein one or more of the ground signal leads comprises a dummy lead that is not connected to a lead external to the semiconductor device package.

12. The method of claim 8, wherein each of the plurality of ground signal leads comprises a plurality of bond wire landing points.

13. The method of claim 8 further comprising:

forming the bond wire ring structure in a region to reduce mutual induction between pairs of signal leads.

14. The method of claim 8 further comprising:

forming the bond wire ring structure in a region to reduce mutual capacitance between pairs of signal leads.

15. A semiconductor device package comprising:

a plurality of signal leads located in a perimeter region around a semiconductor device die region;

a plurality of ground signal leads, wherein the plurality of ground signal leads are a subset of the plurality of signal leads;

one or more dummy leads, wherein the one or more dummy leads are a second subset of the plurality of signal leads and the dummy leads are not configured to carry a supplied signal;

a bond wire ring structure formed by a daisy chain of bond wires coupling each ground signal lead or dummy lead to a nearest proximity other ground signal lead or other dummy lead, wherein the bond wire ring structure forms a closed loop around the semiconductor device die region.

16. The semiconductor device package of claim 15 further comprising:

a ground flag placed in the semiconductor device die region, wherein the ground flag comprises one or more portions that extend into the perimeter region, and the bond wire ring structure further couples a ground signal lead to a nearest proximity portion of the ground flag that extends into the perimeter region.

17. The semiconductor device package of claim 16 further comprising:

a semiconductor device die affixed to the ground flag, wherein the semiconductor device die comprises a plurality of ground signal pins formed on an exposed major surface of the semiconductor device die, and each of the plurality of ground signal pins is electrically coupled to a corresponding ground signal lead of the plurality of ground signal leads or a dummy lead of the one or more dummy leads.

18. The semiconductor device package of claim 17, wherein the semiconductor device die further comprises a plurality of signal pins formed on the exposed major surface of the semiconductor device die, each of the plurality of signal pins is electrically coupled to a corresponding signal lead of the plurality of signal leads, and the bond wires forming the bond wire ring structure are formed in a region near the plurality of signal leads that provides a ground shield between pairs of signal leads.

19. The semiconductor device package of claim 18, wherein the bond wire ring structure is configured to reduce mutual inductance between pairs of signal leads.

20. The semiconductor package of claim 18, wherein the bond wire ring structure is configured to reduce mutual capacitance between pairs of signal leads.

* * * * *